(12) United States Patent
Kim et al.

(10) Patent No.: US 8,771,928 B2
(45) Date of Patent: Jul. 8, 2014

(54) METHOD FOR MANUFACTURING STAMPER FOR INJECTION MOLDING

(75) Inventors: Young Kyu Kim, Changwon-si (KR); Seok Jae Jeong, Changwon-si (KR)

(73) Assignee: LG Electronics Inc., Seoul (KR)

( * ) Notice: Subject to any disclaimer, the term of this patent is extended or adjusted under 35 U.S.C. 154(b) by 72 days.

(21) Appl. No.: 13/394,447

(22) PCT Filed: Sep. 6, 2010

(86) PCT No.: PCT/KR2010/006034
§ 371 (c)(1),
(2), (4) Date: Mar. 6, 2012

(87) PCT Pub. No.: WO2011/031047
PCT Pub. Date: Mar. 17, 2011

(65) Prior Publication Data
US 2012/0189962 A1    Jul. 26, 2012

(30) Foreign Application Priority Data
Sep. 9, 2009    (KR) .................... 10-2009-0084953

(51) Int. Cl.
*G03F 7/00* (2006.01)
(52) U.S. Cl.
USPC ............................ 430/320; 430/322; 430/325
(58) Field of Classification Search
USPC ............ 430/320, 321, 322, 324, 325; 101/28, 101/483, 484; 428/64.1; 216/11, 41, 83
See application file for complete search history.

(56) References Cited

U.S. PATENT DOCUMENTS

| 6,533,968 | B1 | 3/2003 | Feist et al. ............. 264/1.33 |
| 7,204,188 | B2* | 4/2007 | Oyake et al. ............ 101/483 |
| 7,419,710 | B2* | 9/2008 | Murata et al. ........... 428/64.1 |
| 2002/0182402 | A1 | 12/2002 | Murata et al. ........... 428/332 |
| 2003/0137065 | A1* | 7/2003 | Medower et al. ........ 264/1.33 |
| 2004/0191704 | A1* | 9/2004 | Nishi et al. ............. 430/324 |
| 2004/0226824 | A1 | 11/2004 | Murata et al. ........... 205/50 |

(Continued)

FOREIGN PATENT DOCUMENTS

| CN | 1609283 A | 4/2005 |
| CN | 1727993 A | 2/2006 |

(Continued)

OTHER PUBLICATIONS

International Search Report and Written Opinion dated Aug. 9, 2012 issued in Application No. PCT/KR2010/006034.

(Continued)

*Primary Examiner* — Stewart Fraser
(74) *Attorney, Agent, or Firm* — Ked & Associates, LLP

(57) ABSTRACT

The present invention relates to a method for manufacturing a stamper for injection molding, and more particularly, to a method for manufacturing a stamper for injection molding which can prevent a scratch from forming thereon and has an excellent durability owing to high hardness even after manufacturing of the metal stamper with micro patterns formed thereon is finished. The method for manufacturing a stamper for injection molding includes a pattern forming step for forming a predetermined micro pattern on a substrate, a metal plating step for making metal plating on the substrate to form a stamper having the micro pattern transcribed thereto, a stamper separating step for separating the stamper of the metal plating from the substrate, and a protective layer coating step for coating a protective layer on the stamper for maintaining a mirror surface.

8 Claims, 8 Drawing Sheets

(56) References Cited

U.S. PATENT DOCUMENTS

| | | | |
|---|---|---|---|
| 2005/0127032 A1* | 6/2005 | Nakada et al. | 216/41 |
| 2005/0208435 A1 | 9/2005 | Chen et al. | 430/324 |
| 2006/0187804 A1* | 8/2006 | Iida et al. | 369/272.1 |
| 2006/0275711 A1 | 12/2006 | Fu et al. | 430/320 |
| 2007/0126136 A1 | 6/2007 | Fujita et al. | 264/2.5 |
| 2010/0084785 A1* | 4/2010 | Masuhara et al. | 264/220 |

FOREIGN PATENT DOCUMENTS

| | | |
|---|---|---|
| CN | 1739912 A | 3/2006 |
| CN | 101484614 A | 7/2009 |
| JP | 62-119100 A | 5/1987 |
| JP | 62-146624 A | 6/1987 |
| JP | 11-333885 A | 12/1999 |
| JP | 2000-225620 A | 8/2000 |
| JP | 2003-043203 A | 2/2003 |
| JP | 2004-110882 A | 4/2004 |
| JP | 2009-167497 A | 7/2009 |

OTHER PUBLICATIONS

Chinese Office Action dated Oct. 21, 2013 issued in Application No. 201080040404.3 (with English translation).
European Search Report issued in related Application No. 10815592.0 dated Jan. 30, 2014.

* cited by examiner (a)

(b)

(c)

METHOD FOR MANUFACTURING STAMPER FOR INJECTION MOLDING

TECHNICAL FIELD

The present invention relates to a method for manufacturing a stamper for injection molding, and more particularly, to a method for manufacturing a stamper for injection molding which can prevent a scratch from forming thereon and has an excellent durability owing to high hardness even after manufacturing of the metal stamper with micro patterns formed thereon is finished.

BACKGROUND ART

The injection molding is a method for forming a product identical to a cavity formed in a mold by introducing and filling molten resin into the cavity of the mold of a certain shape and cooling the resin filled in the cavity thus. Recently, along with development of the MEMS technology, different shapes of structures are produced by using the stampers having the micro patterns formed thereon.

Particularly, the injection molding is a general method for mass production of plastic products. Since demands on plastic products of high strength polymer with a long durability increase significantly as the times develop, the injection molding is also being applied to various fields, presently.

Recently, the injection molding is applied, not only to general domestic plastic products, but also even to production of plastic products to be used for a space-air field or a precision optical instrument field, particularly to products which require micro and precise patterns.

That is, the injection molding is used for producing a plastic structure having a micro pattern with a size of a few tens of nanometers to a few tens of micrometers formed on a surface thereof.

In the meantime, in order to provide such a plastic structure having the micro pattern with a size of a few tens of nanometers to a few tens of micrometers, a separate stamper corresponding to the micro pattern is used. In general, the stamper is provided in a shape of plate.

A molded product which can produce an optical effect caused by constructive interference and destructive interference of a light can be manufactured by using the stamper having the micro pattern. For an example, a nano-line width of the micro pattern can be used for a high resolution spectrometer, or a pattern which accelerates scattering of the light can be used for a back light unit of a liquid crystal display device.

Or, by making a photonic band gap effect to take place with a regular arrangement of the micro patterns, the micro pattern can be made to have a feature in which the micro pattern reflects a light of a particular wavelength while transmitting or absorbing lights of other wavelengths.

In general, in order to form a desired micro pattern, the stamper having such a pattern is used. In order to form a prior art micro pattern, the LIGA (Lithographie, Galvanoformung, Abformung in German) process is used.

A process for manufacturing the stamper by using the LIGA process will be described. At first, a substrate is subjected to washing, photoresist coating, and soft baking. Then, the substrate is subjected to exposure and development with a pattern mask of a predetermined shape placed on the substrate. And, a hard baking is performed at a portion having the photoresist removed therefrom, to form the micro pattern of a predetermined shape. After depositing a conductive layer on the pattern formed thus, nickel or copper is plated on the pattern, and a layer of the plating is separated to finish formation of a master stamper.

FIG. 1 illustrates a photograph of a prior art stamper for injection molding.

Since the master stamper manufactured thus has the micro pattern formed thereon, and is used as a mold for producing injection molded products, the master stamper is required to maintain a smooth mirror surface. However, since the prior art master stamper has low hardness of a pattern surface of the nickel or copper, the master stamper has a problem in that, as shown in FIG. 1, a scratch S is formed even by slight contact, and maintenance is difficult.

DISCLOSURE OF INVENTION

Technical Problem

To solve the problems, an object of the present invention is to provide a method for manufacturing a stamper for injection molding, which can maintain a mirror surface of a stamper and prevent a scratch from taking place on the stamper by strengthening surface hardness of the stamper having a micro pattern formed thereon.

Solution to Problem

To achieve these objects and other advantages and in accordance with the purpose of the invention, as embodied and broadly described herein, a method for manufacturing a stamper for injection molding includes a pattern forming step for forming a predetermined micro pattern on a substrate, a metal plating step for making metal plating on the substrate to form a stamper having the micro pattern transcribed thereto, a stamper separating step for separating the stamper of the metal plating from the substrate, and a protective layer coating step for coating a protective layer on the stamper for maintaining a mirror surface.

Preferably, the metal plated in the metal plating step is nickel or copper.

Preferably, the protective layer is formed of titanium nitride.

Preferably, the protective layer coating step includes the step of coating titanium nitride by electron-beam evaporation.

Preferably, the protective layer coating step includes the step of directing an electron beam to titanium in a vacuum chamber of a nitrogen atmosphere, or a nitrogen and argon atmosphere to deposit titanium ions and nitrogen ions on the stamper.

Preferably, the method further includes an ultrasonic wave washing step for dipping the stamper in a solution and applying an ultrasonic wave thereto for washing the stamper before the protective layer coating step.

Preferably, the solution is acetone solution.

Preferably, the titanium nitride coating has a thickness of 0.2~0.6 µm.

Preferably, the pattern forming step includes the steps of coating photoresist on the substrate, subjecting the photoresist coated thus to soft baking, placing a pattern mask of a predetermined shape on the substrate having the photoresist coated thereon and subjecting the substrate to exposure, subjecting the photoresist exposed thus to development, and hard baking portions of the photoresist having the photoresist removed therefrom partially.

Preferably, the method further includes the step of depositing a seed layer on the pattern formed thus after the pattern forming step.

And, the pattern forming step includes the steps of depositing metal on the substrate, electropolishing the metal deposited thus, subjecting the metal to first time anodic oxidation, etching and removing metal oxide formed thus, subjecting the metal not oxidized yet to second time anodic oxidation, and removing a barrier layer formed between the micro pattern and the substrate by the second time anodic oxidation.

Advantageous Effects of Invention

The method for manufacturing a stamper for injection molding of the present invention has following advantageous effects.

By strengthening surface hardness of the stamper having micro patterns formed thereon, a mirror surface of the stamper can be maintained and taking place of scratches is prevented, permitting easy maintenance and management of the stamper manufactured thus.

BRIEF DESCRIPTION OF DRAWINGS

The accompanying drawings, which are included to provide further understanding of the disclosure and are incorporated in and constitute a part of this application, illustrate embodiments of the disclosure and together with the description serve to explain the principle of the disclosure.

In the drawings.

BEST MODE FOR CARRYING OUT THE INVENTION

Reference will now be made in detail to the specific embodiments of the present invention, examples of which are illustrated in the accompanying drawings. Wherever possible, the same reference numbers will be used throughout the drawings to refer to the same or like parts.

A method for manufacturing a stamper for injection molding of the present invention includes a pattern forming step for forming a predetermined micro pattern on a substrate, a metal plating step for plating the substrate with metal to form a stamper having the micro pattern transcribed thereto, a stamper separating step for separating the stamper from the substrate, and a protective layer coating step for coating a protective layer on the pattern of the stamper for maintaining a mirror surface.

In the stamper manufacturing method of the present invention, there can be two embodiments according to methods for forming the micro pattern on the substrate in the pattern forming step. At first, processes for forming the micro pattern on the substrate in accordance with the two embodiments will be described, respectively.

FIGS. 2(a)~2(g) illustrate sections showing the steps of a method for manufacturing a master stamper in accordance with a first preferred embodiment of the present invention, by the LIGA (Lithographie, Galvanoformung, Abformung in German) process.

It is preferable that the step for forming the pattern in accordance with the first preferred embodiment of the present invention includes the steps of coating photoresist 20 on a substrate 10, subjecting the photoresist 20 coated thus to soft baking, placing a pattern mask 30 of a predetermined shape on the photoresist 20 and exposing the photoresist 20, and hard baking portions of the photoresist having the photoresist removed therefrom partially.

Figure 2:
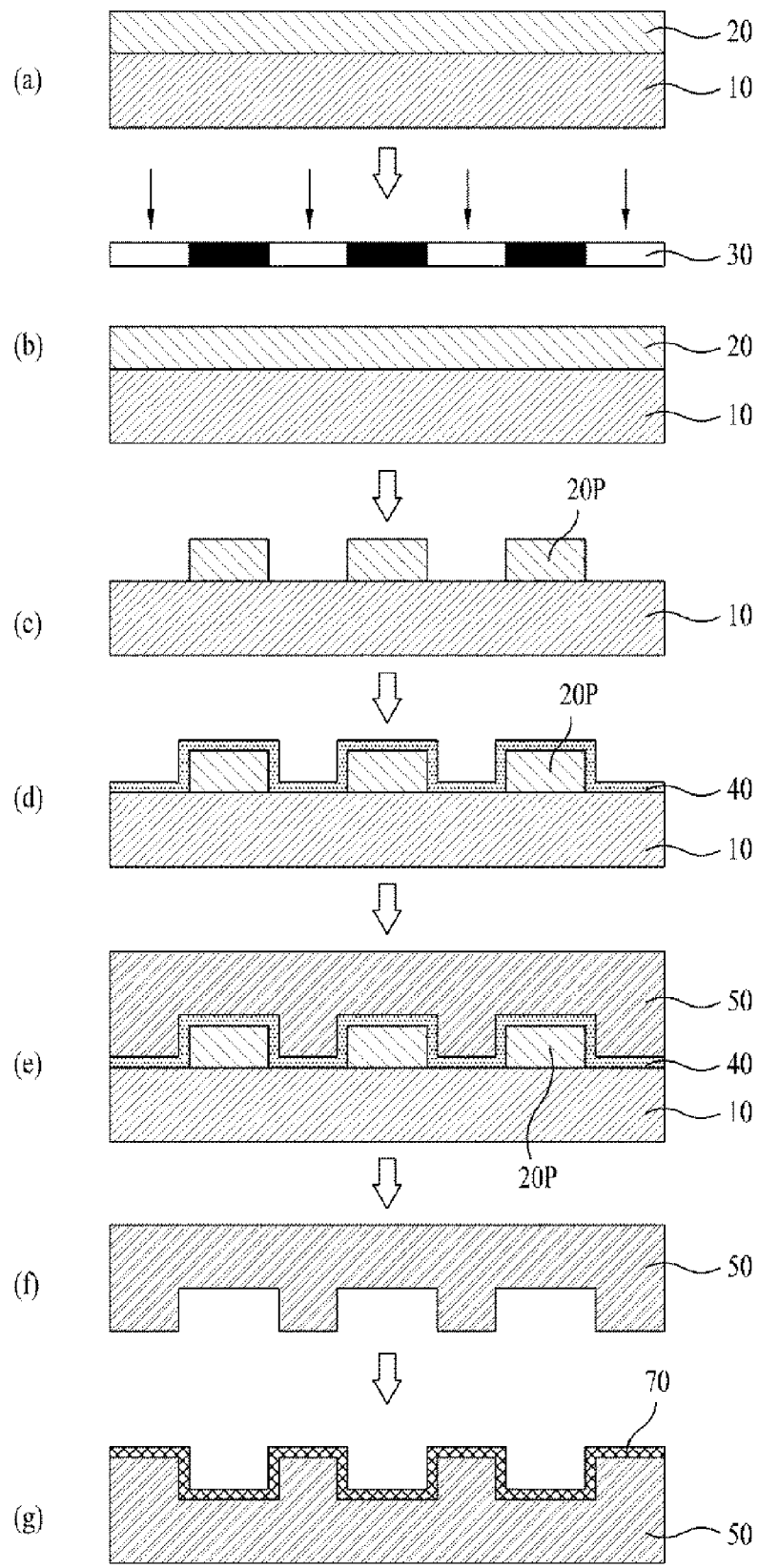
FIGS. 2(a)~2(g) illustrate sections showing the steps of a method for manufacturing a master stamper by the LIGA process.

The substrate 10 can be formed of a film of silicon, glass or synthetic resin. At first, as shown in FIG. 2(a), the substrate 10 is washed to remove impurity from a surface thereof, and a thickness of photoresist 20 is coated on the substrate 10, and the substrate 10 having the photoresist 20 coated thereon is subjected to soft baking. Then, as shown in FIG. 2B, a mask 30 having a micro pattern formed thereon is placed on the substrate 10, and the substrate 10 with the mask 30 placed thereon is subjected to exposure and development and hard baking, to form a micro pattern 20P on the photoresist 20 as shown in FIG. 2C. It is preferable that the micro pattern 20P has a thickness of about 1.5 μm and a width of about 2 μm.

Though metal plating can be performed on the micro pattern 20P formed thus directly, it is preferable that a step for depositing a seed layer 40 on the micro pattern 20P is included further after the pattern forming step.

Referring to FIG. 2(d), the seed layer 40 is coated on the micro pattern 20P formed thus to a fixed thickness. The seed layer 40 serves as a mold release layer for making separation of the metal plating layer 50 from the micro pattern 20P easy after the metal plating. Therefore, it is required to form the seed layer 40 thin so as not to affect a pattern to be transcribed to the metal plating. The seed layer 40 is formed of CrON, DLC (Diamond Like Carbon), C4F8, or SAM (Self-Assembled Monolayer) by vacuum deposition.

Then, referring to FIG. 2(e), a metal plating is performed on the seed layer 40. Mostly, the stamper is formed of nickel Ni, or copper Cu, and of the nickel and the copper, nickel Ni is used more, which has good properties in view of hardness and durability.

It is preferable that the metal plating layer 50 formed by the metal plating has a thickness of about 500 μm, with a thickness of a portion of the micro pattern being about 2 μm. For convenience's sake, the pattern portion is shown to have a thickness similar to the thickness of the metal plating in FIG. 2(e).

Then, if the metal plating layer 50 having the micro pattern transcribed thereto is separated from the seed layer 40 by releasing the metal plating layer 50 from the seed layer 40, the metal plating layer 50 separated thus is the very stamper having the micro pattern formed thereon. In this instance, the seed layer 40 makes separation of the metal plating layer 50 easy.

Finally, referring to FIG. 2(g), if a protective layer of titanium nitride TiN is coated on a surface of the pattern of the metal plating layer 50 separated thus, formation of a master stamper having an excellent surface hardness is finished. It is required that the protective layer is formed of a material which enables easy and very thin coating and has an excellent surface hardness after the coating. As such a material, the titanium nitride is preferable.

In the meantime, before the protective layer coating step, it is preferable to include an ultrasonic washing step for dipping the stamper in a solution and applying an ultrasonic wave thereto, further. Though there can be different kinds of solutions, it is preferable that an acetone solution is used, which is easily available commercially and excellent for washing metal, taking that the stamper is formed of nickel or copper and has the micro pattern formed thereon into account. By removing the impurity from the stamper with the ultrasonic washing, a phenomenon can be prevented from taking place, in which some of large titanium ions react with the impurity present on a surface of the stamper and stuck thereto in the protective layer coating step, thereby enabling to maintain the mirror surface.

It is preferable that titanium nitride is coated by electron beam deposition in the protective layer coating step. In the electron beam deposition, a strong electron beam is directed to titanium in a vacuum chamber of a nitrogen atmosphere or a nitrogen and argon atmosphere for depositing titanium ions and nitrogen ions on the stamper. High energy electrons of the electron beam hit the titanium to cause plasma discharge, and the titanium ions $Ti^+$ bouncing out of the plasma discharge stuck to the surface of the metal stamper. Along with this, some of the nitrogens in the chamber are ionized by the plasma discharge. Of the ionized nitrogens, nitrogen ions $N^+$ stuck to the metal stamper and the titanium ions $Ti^+$ react, to form titanium nitride TiN, and as the reaction continues, a titanium nitride coated layer 70 is formed.

It is preferable that the titanium nitride coated layer 70 has a thickness of 0.2~0.6 μm, because, if the thickness of the titanium nitride coated layer 70 is too thick, the thickness affects the micro pattern of the stamper, and if too thin, desired hardness is not obtainable.

Figure 3:
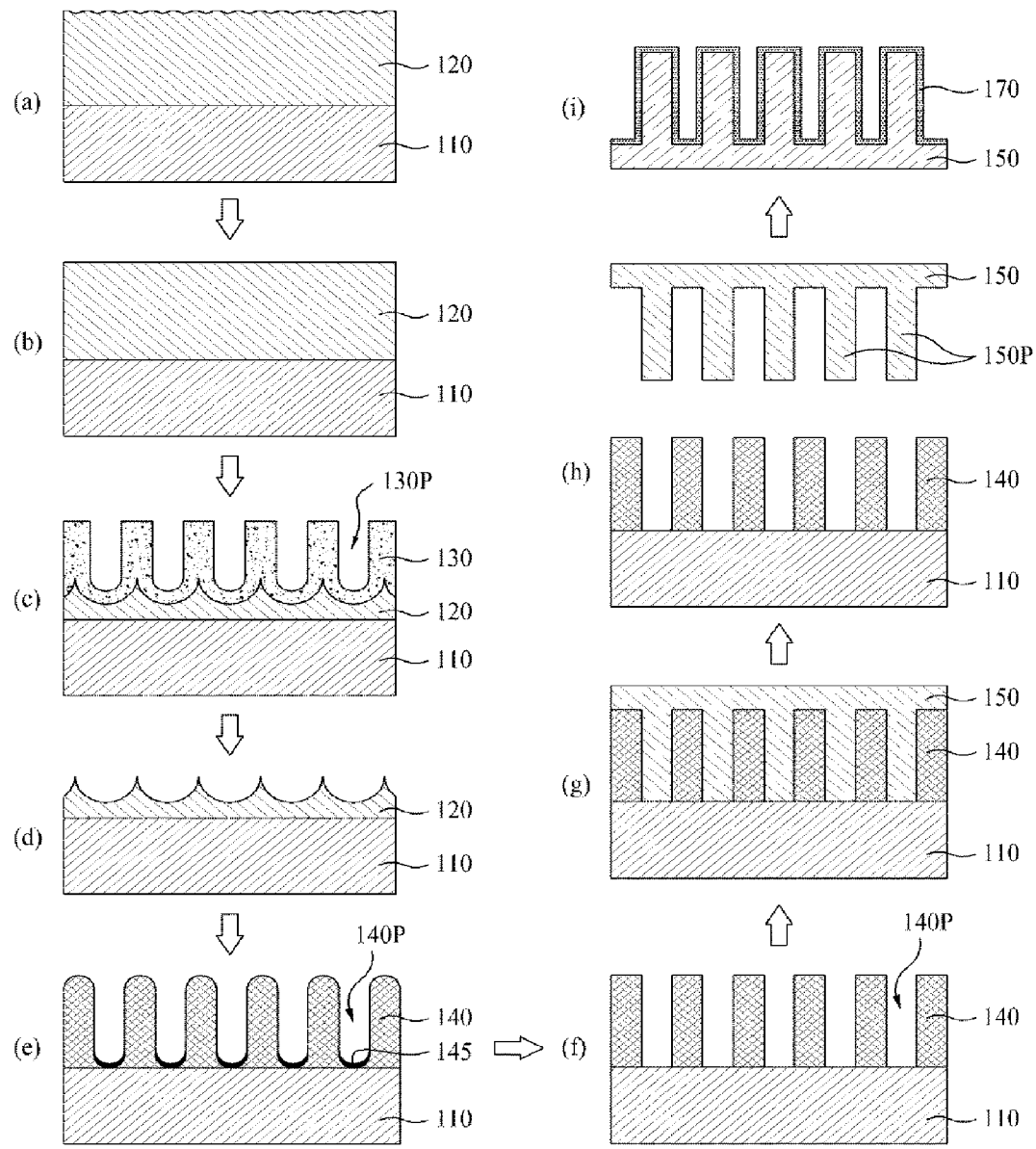
FIGS. 3(a)~3(i) illustrate sections showing the steps of a method for manufacturing a master stamper by an AAO process.
Figure 4:
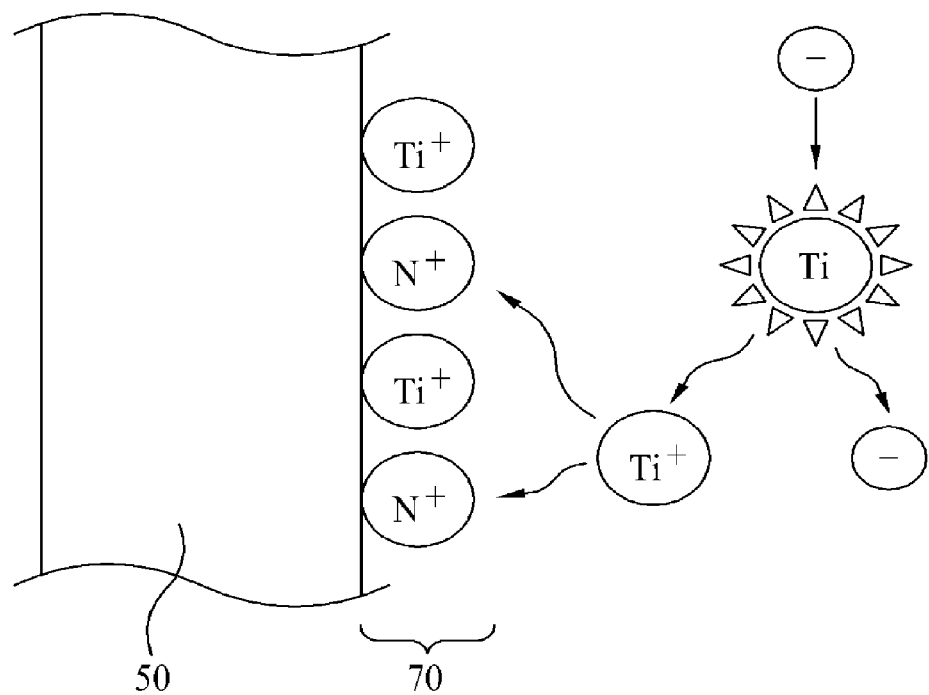
FIG. 4 illustrates a schematic view of coating titanium nitride on a stamper having a micro pattern formed thereon by directing an electron beam onto the stamper.

In the meantime, an AAO (Anodized Aluminum Oxide) process will be described with reference to FIG. 3, in which the stamper is manufactured by a method different from the LIGA process in the pattern forming step.

The pattern forming step in the method for manufacturing a stamper for injection molding in accordance with a second preferred embodiment of the present invention includes the steps of depositing metal on a substrate, subjecting the metal deposited thus to electropolishing, subjecting the metal to anodic oxidation for a first time, subjecting the metal not oxidized yet to anodic oxidation for a second time, and removing a barrier layer formed between a micro pattern and the substrate at the anodic oxidation of the second time.

FIGS. 3(a)~3(i) illustrate sections showing the steps of a method for manufacturing a master stamper by the AAO process in which a micro pattern is formed on a substrate, metal is plated on the micro pattern, and titanium nitride is coated on the metal plating.

In a stamper manufacturing process for providing a metal stamper, as shown in FIG. 3(a), 5~10 μm of metal 120 like aluminum Al is deposited on a predetermined substrate 110, and surface roughness of the metal deposit thus is adjusted to be below 3~5 nm by electropolishing. The electropolishing is a metal polishing method in which minute peak portions on a surface of metal of an anode dissolve selectively compared to other surface portions at the time of electrolysis. If metal intended to polish is made to be an anode and is subjected to electrolysis in electrolyte, a metal surface can be polished.

Next, a first time anodic oxidation step as shown in FIG. 3(c), an etching step as shown in FIG. 3(d), and a second time anodic oxidation step as shown in FIG. 3(e) are performed, to provide a stamper of metal oxide having regular distribution of nano-sized or micro sized patterns or holes with fixed pitch or radius.

Respective steps will be reviewed in detail. As shown in FIG. 3(c), a first time anodic oxidation is performed, to make a portion of an aluminum layer 120 to be in contact with electrolyte to turn the portion of the aluminum layer into alumina $Al_2O_3$ 130, to form a micro pattern 130P having a predetermined depth.

Then, referring to FIG. 3(d), an etching is performed, to remove the alumina 130 formed in the first time anodic oxidation, leaving only aluminum 120 on the substrate 110.

Next, referring to FIG. 3(e), a second time anodic oxidation is performed, to turn the aluminum 120 left thus into alumina 140. A micro pattern 140P formed in this process has a depth close to a surface of the substrate 110, and a greater width, instead.

In this process, a barrier layer 145 is formed between the micro pattern 140P and the substrate 110 as a side product of the anodic oxidation.

Upon removal of the barrier layer 145 with an acidic solution, as shown in FIG. 3(f), a substrate 110 having the micro pattern 140P formed in an alumina layer 140 is produced.

Then, as shown in FIG. 3(g), a metal plating structure 150 of nickel Ni or copper Cu is formed by electroforming on the micro pattern to cover the micro pattern, and, as shown in FIG. 3H, the metal plating structure 150 having the micro pattern 140P transcribed thereto is separated from the substrate, to form a durable metal structure 150 having a predetermined micro pattern 150P, i.e., a stamper.

Finally, referring to FIG. 3(i), upon coating titanium nitride 170 on a micro pattern surface of the stamper 150 formed thus to a thickness of 0.2~0.6 μm, manufacturing of the master stamper of the present invention is finished. Detailed description of the coating of the titanium nitride 170 on the surface of the stamper, which is identical to the first embodiment, will be omitted.

Thus, the AAO method enables an accurate and reproducible control of manufacturing of the stamper having a desired pattern at a low cost, simply.

Figure 1:
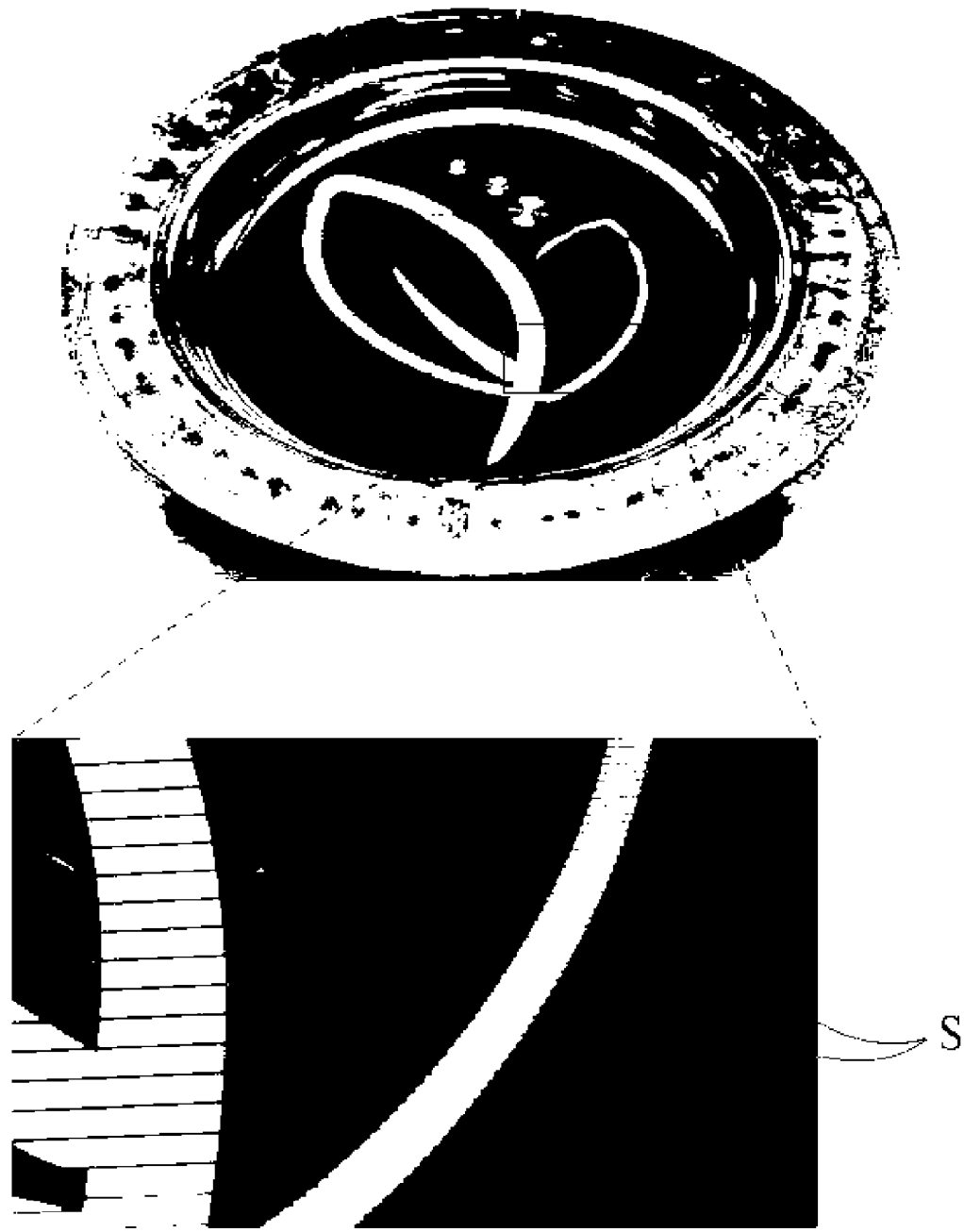
FIG. 1 illustrates a photograph of a prior art stamper for injection molding, showing a scratch formed thereon.
Figure 5:
FIG. 5 illustrates a photograph showing a stamper for injection molding manufactured by a method for manufacturing a stamper of the present invention.

FIG. 5 illustrates a photograph showing a master stamper manufactured by a method of the present invention. The stamper manufactured by nickel plating in the prior art shown in FIG. 1 has a silvery gray color. However, it is possible to notice that the stamper manufactured by the present invention shown in FIG. 5 has a golden color, excellent hardness, and significantly reduced scratches despite of repetitive injection molding.

In the meantime, in a case the stamper is manufactured by the LIGA process or the AAO process, it is possible to make the predetermined structure having the pattern transcribed thereto to display a hologram by adjusting a pitch.

That is, when the user looks at a portion of the domestic appliance where the structure having the micro pattern transcribed thereto is mounted thereto, a color of a surface of the structure varies with a direction of view, thereby producing the hologram effect. Because the micro pattern causes refraction and interference of the light directed to the structure injection molded thus from a front side thereof, varying a wavelength of the light refracted and interfered at the micro pattern too, the color varies.

And, if a distance between the micro patterns formed on the injection molded structure is made greater or smaller by adjusting the distance of the micro patterns formed on the stamper 50 or 150, a path of the light is changed. According to this, since the wavelength of the light refracted and interfered at the micro pattern of the structure changes to change a color thereof, structures having different designs can be injection molded.

The structure manufactured according to the present invention can be molded by the stamper as structures of, not only a button shape illustrated in FIG. 5, but also various 3(d) shapes, for use as decorative members of the domestic appliances.

Figure 7:
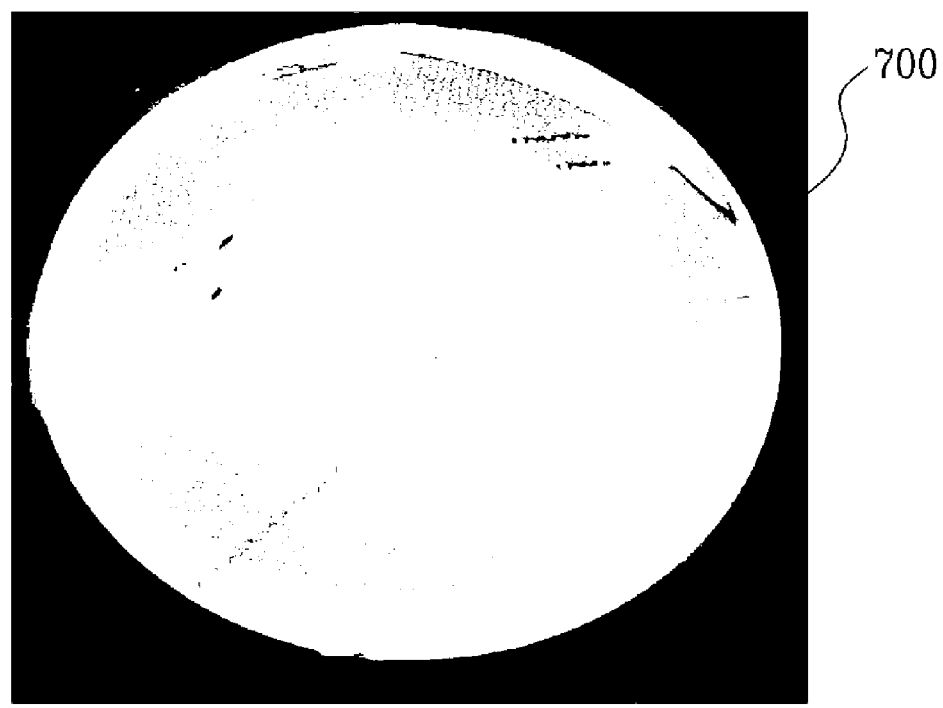
Figure 8:
FIG. 8 illustrates a perspective view showing the structures in FIGS. 6 and 7 are mounted to a refrigerator.
Figure 9:
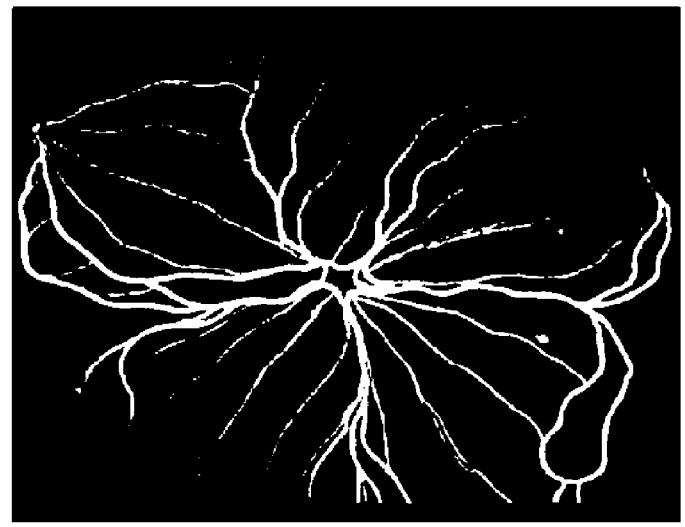
FIGS. 9(a)~9(c) illustrates photographs showing semi-finished products of panel or film shape injection molded by stampers having different designs according to the present invention.
Figure 9:
Figure 9:

FIGS. 7 and 8 illustrate photographs of button shaped structures 700 injection molded by stampers having the micro patterns shown in FIG. 5, respectively. The structures 700 have predetermined patterns formed by the micro patterns of the stampers, and the patterns display full natural colors owing to the refraction, reflection, and interference of the light.

Figure 6:
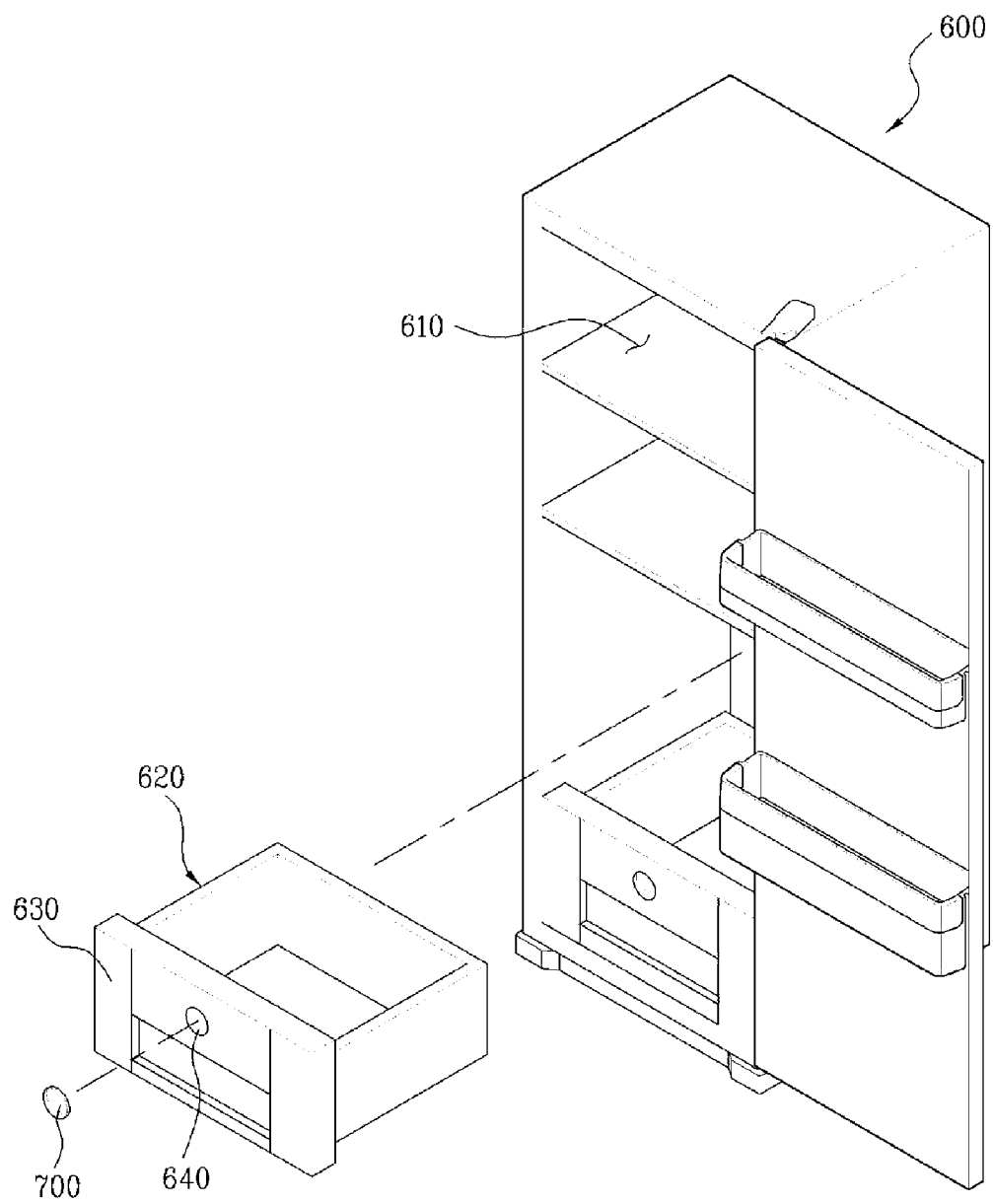
FIGS. 6 and 7 illustrate photographs of structures injection molded by stampers manufactured according to the present invention, respectively.

FIG. 6 illustrates a refrigerator having the structures 700 in FIGS. 7 and 8 mounted thereto. The refrigerator includes a body 600 having a storage chamber 610 provided therein with a storage box 620 mounted therein for storage of storage objects. The structure 700 is mounted to a front 630 of the storage box 620 having a mounting recess 640 for mounting the structure 700 thereto. Accordingly, the structure 700 serves as a decorative member for decorating the front of the storage box 620.

And, by using the stamper of the present invention, the structure having the micro pattern can be manufactured in a panel or film shape too, and the decorative members in the panel or film shape manufactured thus can be applied to different domestic appliances, such as refrigerator, washing machine, air conditioner, cooking utensil, and so on. FIGS. 9(a), 9(b) and 9(c) illustrate patterns and characters formed on a front panel of an indoor unit of an air conditioner, a front panel of a refrigerator door, or a front control panel or a front panel of a washing machine or a cooking utensil, wherein it appears that the patterns and the characters emit lights when the patterns and the characters are seen from an outside of the structure.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. A method for manufacturing a stamper for injection molding, comprising:

a pattern forming step for forming a predetermined micro pattern on a substrate;

a metal plating step for making metal plating on the substrate to form a stamper having the micro pattern transcribed thereto, wherein the metal plating is nickel or copper;

a stamper separating step for separating the stamper of the metal plating from the substrate; and a protective layer coating step for coating a protective layer that includes a titanium nitride coating on the stamper by electron-beam evaporation for maintaining a mirror surface.

2. The method as claimed in claim 1, wherein the protective layer coating step includes the step of directing an electron beam to titanium in a vacuum chamber of a nitrogen atmosphere, or a nitrogen and argon atmosphere to deposit titanium ions and nitrogen ions on the stamper.

3. The method as claimed in claim 1, further comprising an ultrasonic wave washing step for dipping the stamper in a solution and applying an ultrasonic wave thereto for washing the stamper before the protective layer coating step.

4. The method as claimed in claim 3, wherein the solution is acetone solution.

5. The method as claimed in claim 1, wherein the titanium nitride coating has a thickness of 0.2~0.6 µm.

6. The method as claimed in claim 1, wherein the pattern forming step includes the steps of;

coating photoresist on the substrate, subjecting the photoresist coated thus to soft baking, placing a pattern mask of a predetermined shape on the substrate having the photoresist coated thereon and subjecting the substrate to exposure, subjecting the photoresist exposed thus to development, and hard baking portions of the photoresist having the photoresist removed therefrom partially.

7. The method as claimed in claim 1, further comprising the step of depositing a seed layer on the pattern formed thus after the pattern forming step.

8. The method as claimed in claim 1, wherein the pattern forming step includes the steps of:

depositing metal on the substrate, electropolishing the metal deposited thus, subjecting the metal to first time anodic oxidation, etching and removing metal oxide formed thus, subjecting the metal not oxidized yet to second time anodic oxidation, and removing a barrier layer formed between the micro pattern and the substrate by the second time anodic oxidation.

* * * * *